United States Patent
Tanabe

(10) Patent No.: US 11,022,660 B2
(45) Date of Patent: Jun. 1, 2021

(54) MAGNETIC SENSOR INCLUDING A MAGNETIC MEMBER OFFSET FROM A MAGNETORESISTIVE EFFECT ELEMENT

(71) Applicant: TDK CORPORATION, Tokyo (JP)

(72) Inventor: Kei Tanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 367 days.

(21) Appl. No.: 16/085,706

(22) PCT Filed: Oct. 20, 2016

(86) PCT No.: PCT/JP2016/081108
§ 371 (c)(1),
(2) Date: Sep. 17, 2018

(87) PCT Pub. No.: WO2017/163471
PCT Pub. Date: Sep. 28, 2017

(65) Prior Publication Data
US 2020/0300936 A1    Sep. 24, 2020

(30) Foreign Application Priority Data
Mar. 23, 2016 (JP) .............................. JP2016-059004

(51) Int. Cl.
    *G01R 33/09*    (2006.01)
    *H01L 43/08*    (2006.01)
    (Continued)

(52) U.S. Cl.
    CPC .......... *G01R 33/09* (2013.01); *G01R 33/1253* (2013.01); *G11B 5/3903* (2013.01);
    (Continued)

(58) Field of Classification Search
None
See application file for complete search history.

(56) References Cited

U.S. PATENT DOCUMENTS 4,480,248 A * 10/1984 Sudo ...................... H01L 43/08
    257/E43.004
4,922,360 A * 5/1990 Takano ................ G11B 5/3987
    360/322

(Continued)

FOREIGN PATENT DOCUMENTS

JP    2013-210335 A    10/2013
JP    2015-1467 A    1/2015
(Continued)

*Primary Examiner* — Jefferson A Evans
(74) *Attorney, Agent, or Firm* — Young Law Firm, P.C.

(57) ABSTRACT

The size and cost of a magnetic sensor suitable for closed loop control is reduced. A magnetic sensor includes a magnetoresistive effect element that is electrically connected between terminals and extends in the x-direction and a magnetic member that is electrically connected between the terminals and extends in the x-direction along the magnetoresistive effect element. The magnetoresistive effect element is disposed offset with respect to the center position of the magnetic member in the y-direction. Magnetic flux to be detected is collected by a magnetic member and current is made to flow in the magnetic member in accordance with the resistance value of the magnetoresistive effect element, achieving closed loop control. The magnetic member functions both as a magnetism collection function and as a cancel coil, which reduces the number of elements required, and which also achieves a reduction in size and cost.

16 Claims, 7 Drawing Sheets

(51) Int. Cl.
    *G01R 33/12*     (2006.01)
    *H01L 43/10*     (2006.01)
    *G11B 5/39*     (2006.01)

(52) U.S. Cl.
    CPC .............. *H01L 43/08* (2013.01); *H01L 43/10* (2013.01); *G11B 5/3906* (2013.01)

(56) References Cited

U.S. PATENT DOCUMENTS

| | | | | |
|---|---|---|---|---|
| 6,154,350 | A * | 11/2000 | Lee | G11B 5/3903 360/327.22 |
| 6,724,582 | B2 * | 4/2004 | Funayama | B82Y 10/00 257/E43.004 |
| 8,243,502 | B2 * | 8/2012 | Sakimura | G11C 11/18 365/158 |
| 10,107,871 | B2 * | 10/2018 | Deak | H01L 43/12 |
| 10,126,378 | B2 * | 11/2018 | Deak | G01R 33/091 |
| 2005/0068684 | A1 * | 3/2005 | Gill | G11B 5/33 360/314 |
| 2010/0248623 | A1 * | 9/2010 | Haratani | H04B 5/0081 455/41.1 |
| 2013/0057273 | A1 * | 3/2013 | Ide | G01R 33/093 324/252 |
| 2013/0057274 | A1 * | 3/2013 | Ide | G01R 33/093 324/252 |
| 2014/0375311 | A1 * | 12/2014 | Ishii | G01R 33/093 324/252 |
| 2015/0331072 | A1 * | 11/2015 | Ogawa | G01R 33/1253 324/252 |
| 2015/0362564 | A1 * | 12/2015 | Wan | G01R 33/0011 324/239 |
| 2015/0377985 | A1 * | 12/2015 | Ide | H01L 43/10 324/252 |
| 2018/0081001 | A1 * | 3/2018 | Iwasaki | G01R 33/093 |
| 2018/0275217 | A1 * | 9/2018 | Uchida | G01R 33/098 |
| 2019/0018083 | A1 * | 1/2019 | Fujiwara | G01R 33/093 |
| 2019/0081606 | A1 * | 3/2019 | Yamane | H03B 15/006 |
| 2019/0086447 | A1 * | 3/2019 | Takano | G01R 15/207 |
| 2019/0219616 | A1 * | 7/2019 | Cadugan | G01R 15/205 |
| 2020/0355758 | A1 * | 11/2020 | Tanabe | G01R 33/0017 |

FOREIGN PATENT DOCUMENTS

| | | |
|---|---|---|
| JP | 2015219061 A | 12/2015 |
| JP | 2016-125901 A | 7/2016 |
| WO | 2009151023 A1 | 12/2009 |

* cited by examiner

MAGNETIC SENSOR INCLUDING A MAGNETIC MEMBER OFFSET FROM A MAGNETORESISTIVE EFFECT ELEMENT

TECHNICAL FIELD

The present invention relates to a magnetic sensor and, more particularly, to a magnetic sensor suitable for closed loop control.

BACKGROUND ART

A magnetic sensor that can detect even a feeble magnetic flux emitted from a human body or the like is highly influenced by an environmental magnetic field such as terrestrial magnetism. Therefore, it is indispensable for a device of such a type to cancel the influence of the environmental magnetic field.

A magnetic sensor described in Patent Document 1 has a configuration in which a cancel coil, a magnetoresistive effect element, and a magnetic member are laminated in this order on the surface of a sensor chip and achieves closed loop control by leading magnetic flux generated by a magnetic field to be detected to the magnetoresistive effect element and making current flow in the cancel coil in response to a change in the resistance value of the magnetoresistive effect element.

CITATION LIST

Patent Document

[Patent Document 1] JP 2015-219061 A

SUMMARY OF INVENTION

Technical Problem to be Solved by Invention

The magnetic sensor described in Patent Document 1 integrates the cancel coil, magnetoresistive effect element and magnetic member into one sensor chip and thus has an excellent feature in that the entire size thereof is very small. However, in recent years, further reduction in size and cost is required for magnetic sensors.

It is therefore an object of the present invention to further reduce the size and cost of a magnetic sensor suitable for closed loop control.

Means for Solving Problem

A magnetic sensor according to the present invention includes first to fourth terminals, a first magnetoresistive effect element electrically connected between the first and second terminals and extending in a first direction, and a first magnetic member electrically connected between the third and fourth terminals and extending in the first direction along the first magnetoresistive effect element. The first magnetoresistive effect element is disposed offset with respect to the center position of the first magnetic member in a second direction crossing the first direction.

According to the present invention, magnetic flux to be detected is collected by the first magnetic member, and current is made to flow in the first magnetic member in accordance with the resistance value of the first magnetoresistive effect element, whereby closed loop control can be achieved. That is, the first magnetic member has both a magnetism collection function and a function as a cancel coil, thereby reducing the number of circuit elements required, which allows achievement of reduction in size and cost. When actually performing the closed loop control, a feedback circuit that makes feedback current flow between the third and fourth terminals based on the potential appearing at the first or second terminal may be added. The first magnetic member is preferably made of a soft magnetic material.

In the present invention, the first magnetoresistive effect element is preferably disposed at a position that does not overlap the first magnetic member when viewed in a third direction crossing the first and second directions. This allows most of magnetic flux components that are bent in the second direction by the first magnetic member to be given to the first magnetoresistive effect element, so that it is possible to obtain higher detection sensitivity when the magnetization fixing direction of the first magnetoresistive effect element is the second direction.

In the present invention, the length of the first magnetic member in the first direction is preferably equal to or larger than the length of the first magnetoresistive effect element in the first direction. This allows a magnetic field in the second direction to be obtained over a wider area of the first magnetoresistive effect element, so that it is possible to obtain higher detection sensitivity when the magnetization fixing direction of the first magnetoresistive effect element is the second direction.

Preferably, the magnetic sensor according to the present invention further includes a fifth terminal, a second magnetoresistive effect element electrically connected between the second and fifth terminals and extending in a predetermined direction, and a second magnetic member electrically connected between the third and fourth terminals and extending in the predetermined direction along the second magnetoresistive effect element, and the second magnetoresistive effect element is disposed offset with respect to the center position of the second magnetic member in a direction crossing the predetermined direction. This allows a differential signal to be obtained by the two magnetoresistive effect elements, making it possible to further enhance detection sensitivity.

Preferably, in the present invention, the first magnetoresistive effect element is formed on a first wiring layer of a sensor chip, and the first magnetic member is formed on a second wiring layer of the sensor chip different from the first wiring layer. This allows three functions of a magnetism collection function, a magnetic detection function, and a magnetic field cancel function to be achieved by the two wiring layers. In this case, the first magnetic member may be a block member made of a magnetic material and fixed to the second wiring layer or may be a thin film made of a magnetic material and formed on the second wiring layer.

Advantageous Effects of Invention

According to the present invention, it is possible to achieve further reduction in the size and cost of the magnetic sensor suitable for closed loop control.

MODE FOR CARRYING OUT THE INVENTION

Preferred embodiments of the present invention will now be explained in detail with reference to the drawings.

First Embodiment

Figure 1:
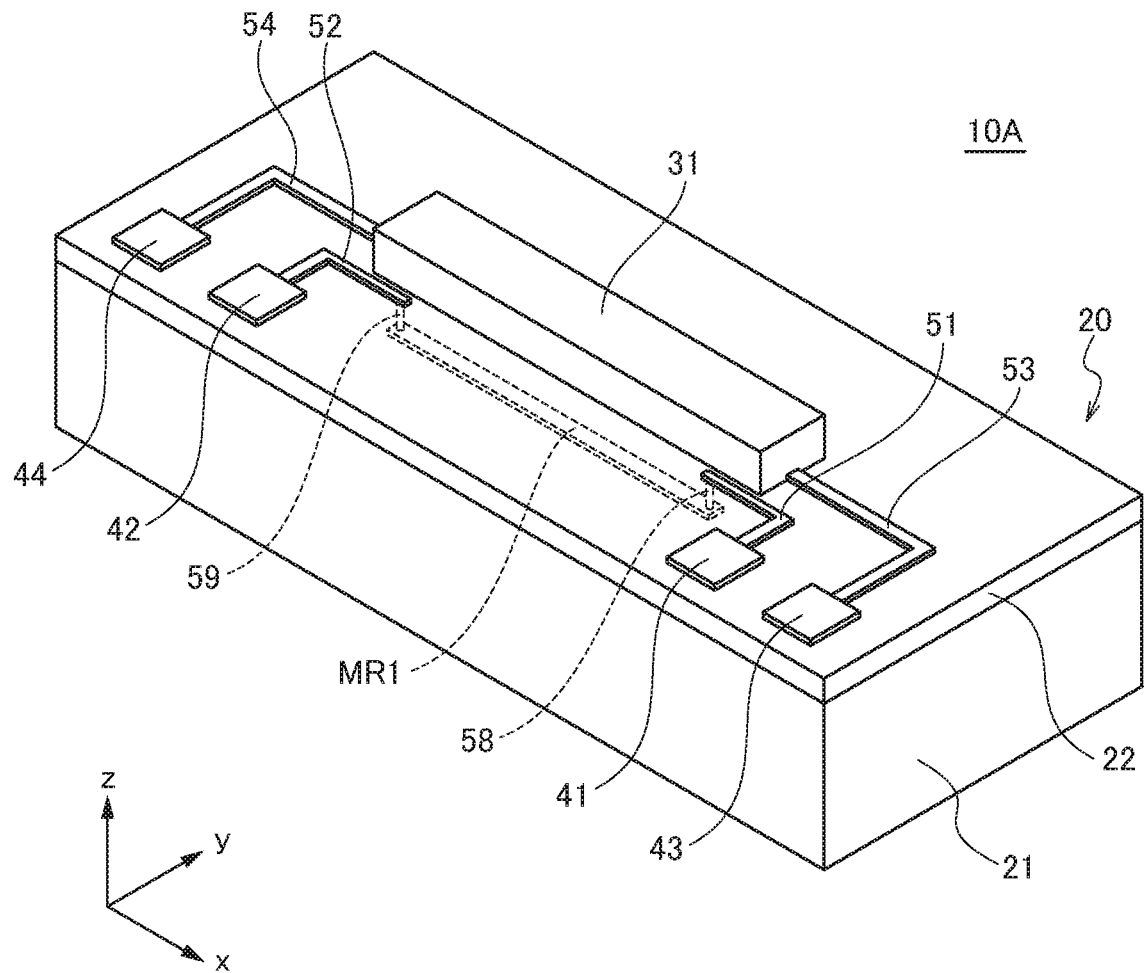
FIG. 1 is a schematic perspective view illustrating the outer appearance of a magnetic sensor 10A according to a first embodiment of the present invention.
Figure 2:
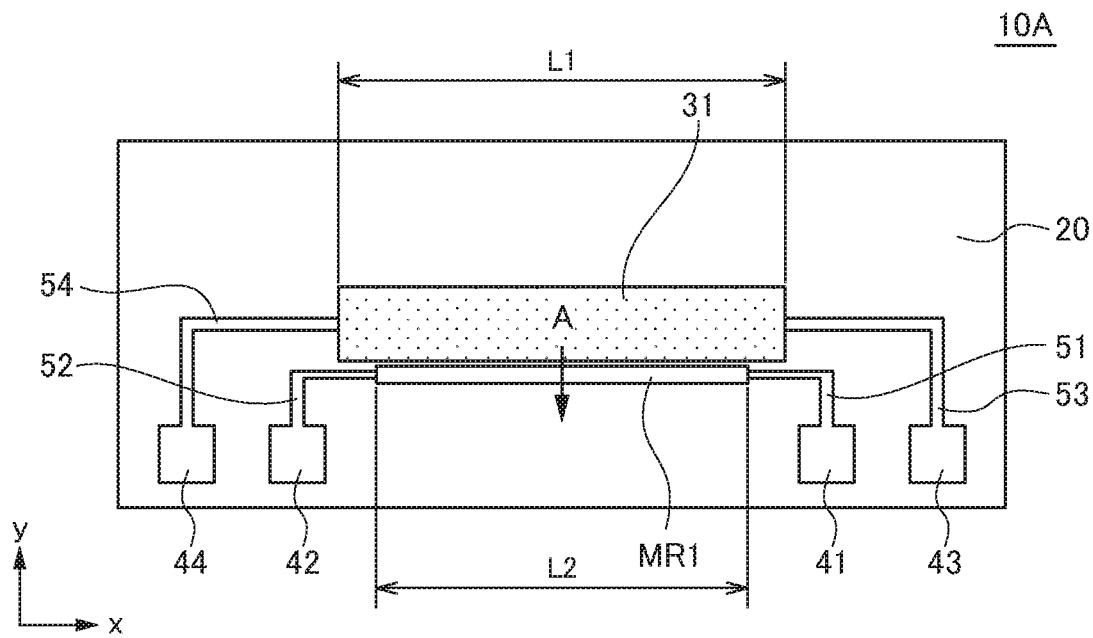
FIG. 2 is a top view of the magnetic sensor 10A.

FIG. 1 is a schematic perspective view illustrating the outer appearance of a magnetic sensor 10A according to the first embodiment of the present invention. FIG. 2 is a top view of the magnetic sensor 10A, and FIG. 3 is a side view of the magnetic sensor 10A.

Figure 3:
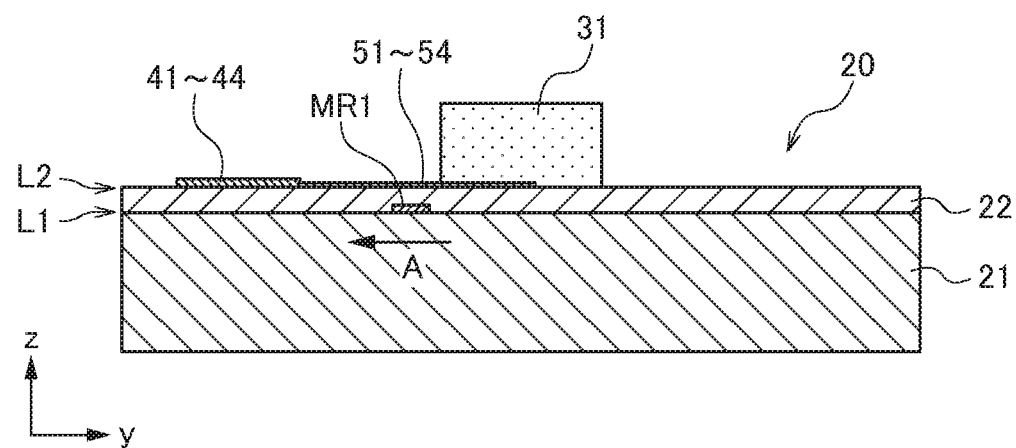
FIG. 3 is a side view of the magnetic sensor 10A.

As illustrated in FIGS. 1 to 3, the magnetic sensor 10A according to the present embodiment includes a sensor chip 20 and a first magnetic member 31 fixed to the sensor chip 20.

The sensor chip 20 has a substrate 21 having a substantially rectangular parallelepiped shape and an insulating film 22 covering the surface of the substrate 21. The surface of the substrate 21 constitutes a first wiring layer L1, and the surface of the insulating film 22 constitutes a second wiring layer L2. In the present embodiment, the number of the wiring layers of the sensor chip is two. The first wiring layer L1 is an xy plane on which a first magnetoresistive effect element MR1 extending in the x-direction that is a first direction is formed. The second wiring layer L2 is also an xy plane on which first to fourth terminals 41 to 44 and first to fourth wirings 51 to 54 are formed. Further, the magnetic member 31 is fixed to the second wiring layer L2. A common method to produce the sensor chip 20 is to form a large number of sensor chips 20 at a time on an aggregate substrate and then to separate them for taking multiple sensor chips; however, the present invention is not limited to this, and the sensor chips 20 may be individually produced.

The magnetoresistive effect element MR1 is an element whose electric resistance is changed in accordance with the direction and strength of a magnetic field, and the magnetization fixing direction thereof is a second direction (y-direction) denoted by the arrow A in FIGS. 2 and 3. One end of the magnetoresistive effect element MR1 in the x-direction is electrically connected to the first terminal 41 through the first wiring 51, and the other end thereof in the x-direction is electrically connected to the second terminal 42 through the second wiring 52. The electric connection between the magnetoresistive effect element MR1 and wirings 51 and 52 is made through through-conductors 58 and 59 penetrating the insulating film 22. Alternatively, a configuration may be possible, in which a part of each of the wirings 51 and 52 that contacts the magnetoresistive effect element MR1 is formed on the first wiring layer L1, and the part formed on the first wiring layer L1 and a part of each of the wirings 51 and 52 formed on the second wiring layer L2 are connected through the through-conductor 58 or 59. As a result, the magnetoresistive effect element MR1 is electrically connected between the first and second terminals 41 and 42.

The magnetic member 31 is a block member made of a soft magnetic material having high permeability and low electric resistance. There is no particular restriction on the material of the magnetic member 31; however, it is preferable to use a material having a permeability of 100 or higher and a resistance value of 1M Ω or smaller. Specific examples of the material include soft iron, permalloy, nickel, a silicon steel sheet, sendust, and amorphous metal (nano-crystal soft magnetic material). While the magnetic member 31 extends in the x-direction along the magnetoresistive effect element MR1, the magnetic member 31 and magnetoresistive effect element MR1 do not overlap each other in a plan view (that is, when viewed in the z-direction), and the magnetoresistive effect element MR1 is disposed offset in the y-direction with respect to the magnetic member 31. One end of the magnetic member 31 in the x-direction is electrically connected to the third terminal 43 through the third wiring 53, and the other end thereof in the x-direction is electrically connected to the fourth terminal 44 through the fourth wiring 54. As a result, the magnetic member 31 is electrically connected between the third and fourth terminals 43 and 44.

A length L1 of the magnetic member 31 in the x-direction is equal to or larger than a length L2 of the magnetoresistive effect element MR1 in the x-direction (L1≥L2), and the magnetoresistive effect element MR1 is adjacent to the magnetic member 31 over the entire length thereof in the x-direction. The magnetic member 31 plays a role of collecting magnetic flux in the z-direction, bending the collected magnetic flux in the y-direction, and applies the same to the magnetoresistive effect element MR1. Since the magnetic member 31 is made adjacent to the magnetoresistive effect element MR1 over the entire length of the magnetoresistive effect element MR1 in the x-direction, a magnetic field in the y-direction can be obtained over a wider area of the magnetoresistive effect element MR1.

Figure 4:
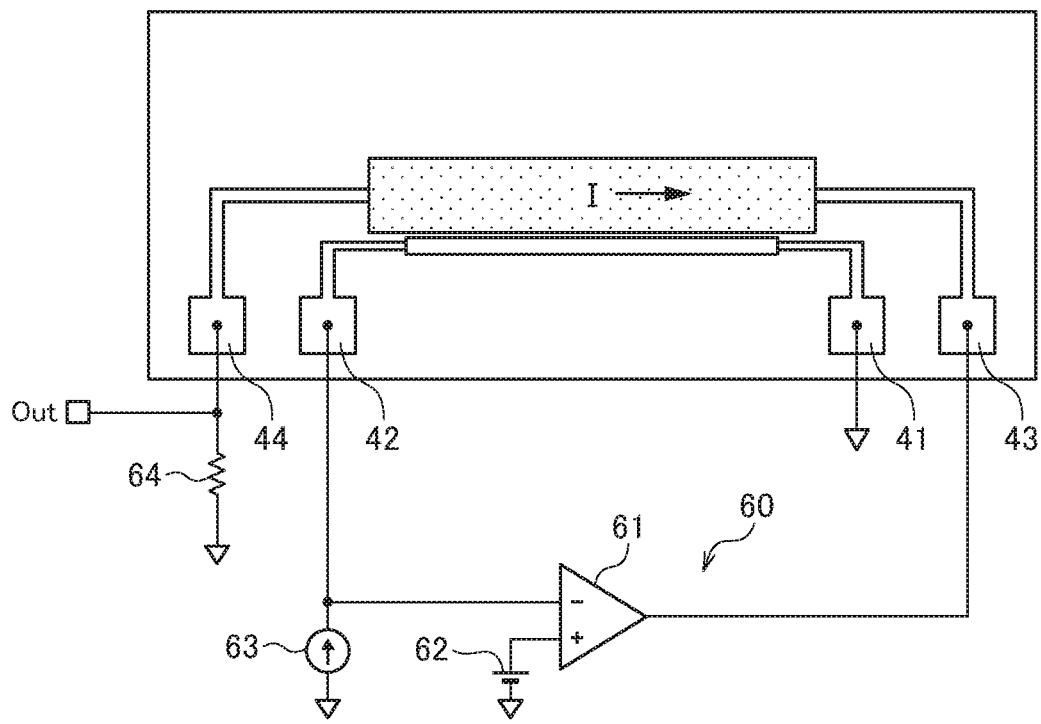
FIG. 4 is a circuit diagram of a feedback circuit 60 connected to the first to fourth terminals 41 to 44.

FIG. 4 is a circuit diagram of a feedback circuit 60 connected to the first to fourth terminals 41 to 44.

As illustrated in FIG. 4, the feedback circuit 60 includes an operation amplifier 61, a constant voltage source 62, a constant current source 63, and a resistor 64. The non-inversion input terminal (+) of the operation amplifier 61 is connected to the constant voltage source 62, and the inversion input terminal (−) thereof is connected to the second terminal 42. The constant current source 63 is also connected to the second terminal 42. The output terminal of the operation amplifier 61 is connected to the third terminal 43. The first terminal 41 is connected to the ground, and the fourth terminal 44 is connected to the ground through the resistor 64. An output level Out of the fourth terminal 44 is supplied to a not-shown detection circuit. With the thus configured feedback circuit 60, the magnetic sensor 10A according to the present embodiment can perform closed loop control.

Figure 5:
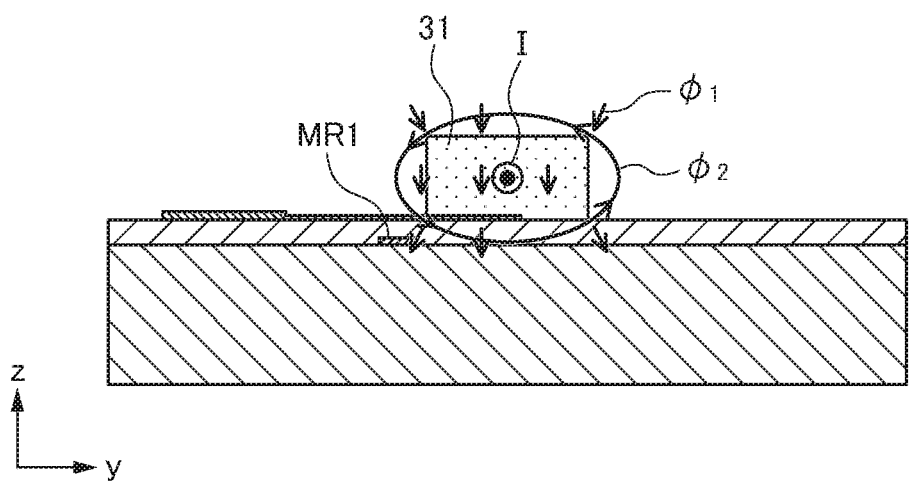
FIG. 5 is a schematic diagram for explaining a direction of magnetic fluxes ϕ1 and ϕ2.

Specifically, as illustrated in FIG. 5, when magnetic flux ϕ1 to be detected is given in the z-direction, it is collected by the magnetic member 31, then bent in the y-direction, and returned to the source of the magnetic flux. Since the magnetoresistive effect element MR1 is disposed on the y-direction side with respect to the magnetic member 31, the resistance value of the magnetoresistive effect element MR1 is varied by the magnetic flux $\phi 1$ (for example, the resistance value is increased). In the example of FIG. 5, the magnetic flux $\phi 1$ is applied in the negative y-direction to the magnetoresistive effect element MR1.

As illustrated in FIG. 4, the second terminal 42 is connected with the constant current source 63. Therefore, if the resistance value of the magnetoresistive effect element MR1 is varied, the potential level of the second terminal 42 varies. For example, when the resistance value of the magnetoresistive effect element MR1 is increased, the potential level of the second terminal 42 rises. When the potential level of the second terminal 42 is varied, the potential level of the output terminal of the operation amplifier 61 varies correspondingly. For example, when the potential level of the second terminal 42 is raised, the potential level of the output terminal of the operation amplifier 61 lowers, with the result that feedback current I flows from the fourth terminal 44 to the third terminal 43.

When the feedback current I flows in the magnetic member 31, a magnetic field is generated around the magnetic member 31 by the so-called corkscrew rule. For example, when the feedback current I flows from the fourth terminal 44 to the third terminal 43, magnetic flux $\phi 2$ is generated thereby in the direction illustrated in FIG. 5 and flows in the positive y-direction at a position where the magnetoresistive effect element MR1 exists. That is, the magnetic flux $\phi 1$ and magnetic flux $\phi 2$ cancel each other, achieving feedback in such a direction that the resistance value of the magnetoresistive effect element MR1 varied by the magnetic flux $\phi 1$ to be detected is set back to the original value, so that closed loop control is made possible. An actual detection result is obtained by a not-shown detection circuit based on the output level Out of the fourth terminal 44.

As described above, in the magnetic sensor 10A according to the present embodiment, the magnetic member 31 that collects the magnetic flux $\phi 1$ to be detected also serves as a cancel coil. This eliminates the need to separately provide a magnetic member for magnetism collection and a cancel coil, thereby reducing the number of elements required. This allows further reduction in the size and cost of the magnetic sensor.

For example, in the present embodiment, by disposing the magnetoresistive effect element MR1 and the magnetic member 31 on the first wiring layer L1 and on the second wiring layer L2, respectively, it is possible to constitute the magnetic sensor 10A by the two wiring layers, whereby the reduction in the size and cost is achieved. It is also possible to dispose both the magnetoresistive effect element MR1 and magnetic member 31 on the same wiring layer and, in this case, a magnetic sensor can be constituted by one wiring layer.

A part or all of the elements constituting the feedback circuit 60 may be integrated on the sensor chip 20 or on another substrate. For example, when the sensor chip 20 is mounted on a printed circuit board, it is possible to form the feedback circuit 60 on the printed circuit board and then to connect the printed circuit board and the magnetic sensor 10A by using bonding wires.

Figure 6:
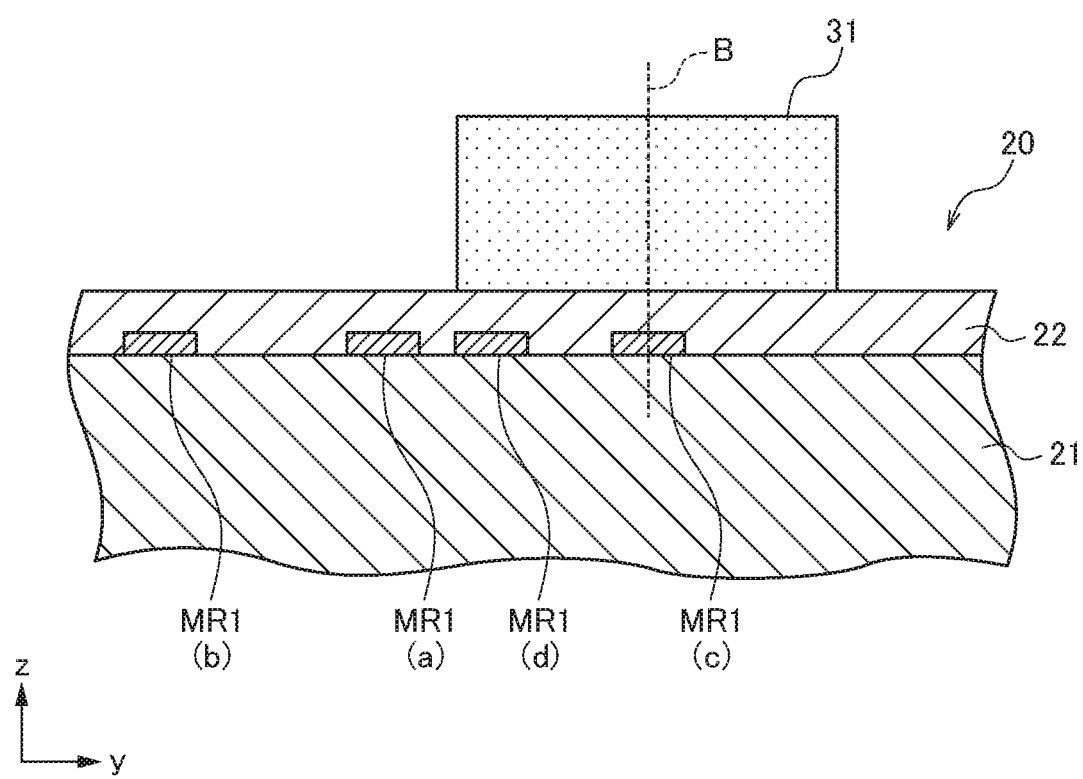
FIG. 6 is a schematic cross-sectional view for more specifically explaining the positional relationship between the magnetoresistive effect element MR1 and the magnetic member 31 in the y-direction.

FIG. 6 is a schematic cross-sectional view for more specifically explaining the positional relationship between the magnetoresistive effect element MR1 and the magnetic member 31 in the y-direction.

In FIG. 6, four positions (a) to (d) are exemplified as the position of the magnetoresistive effect element MR1. The position (a) is the position that has been described using FIGS. 1 to 3. That is, the position (a) does not overlap the magnetic member 31 and is adjacent to the magnetic member 31. At the position (a), the distance from a center position B of the magnetic member 31 in the y-direction to the center of the magnetoresistive effect element MR1 in the y-direction is equal to or smaller than 1 mm. In the present invention, the magnetoresistive effect element MR1 is most preferably disposed at the position (a).

The position (b) is a position that does not overlap the magnetic member 31 in a plan view and is significantly separated from the magnetic member 31. When the distance between the magnetoresistive effect element MR1 and the magnetic member 31 in the y-direction when viewed from the z-direction is large as so at the position (b), influence that the magnetic flux $\phi 1$ and magnetic flux $\phi 2$ have on the magnetoresistive effect element MR1 is reduced, with the result that detection sensitivity is degraded. Considering this point, the distance between the magnetoresistive effect element MR1 and the magnetic member 31 in the y-direction when viewed from the z-direction is preferably equal to or smaller than 1 mm, as described above.

The position (c) is a position coinciding with the center position B of the magnetic member 31 in the y-direction. When the magnetoresistive effect element MR1 is disposed at the position (c), no y-direction component of the magnetic flux $\phi 1$ is given to the magnetoresistive effect element MR1, so that the function as the magnetic sensor is impaired. Thus, it is inadequate to dispose the magnetoresistive effect element MR1 at the position (c).

The position (d) is a position that overlaps the magnetic member 31 in a plan view but is offset from the center position B of the magnetic member 31 in the y-direction. In this case, the y-direction component of the magnetic flux $\phi 1$ is given by a certain amount to the magnetoresistive effect element MR1 and, therefore, the function as the magnetic sensor is properly achieved. However, when the magnetoresistive effect element MR1 overlaps the magnetic member 31 like the position (d) when viewed in the z-direction, the y-direction component of the magnetic flux $\phi 1$ given to the magnetoresistive effect element MR1 is reduced, so that it is desirable to dispose the magnetoresistive effect element MR1 at a position not overlapping the magnetic member 31 like the position (a).

Second Embodiment

Figure 7:
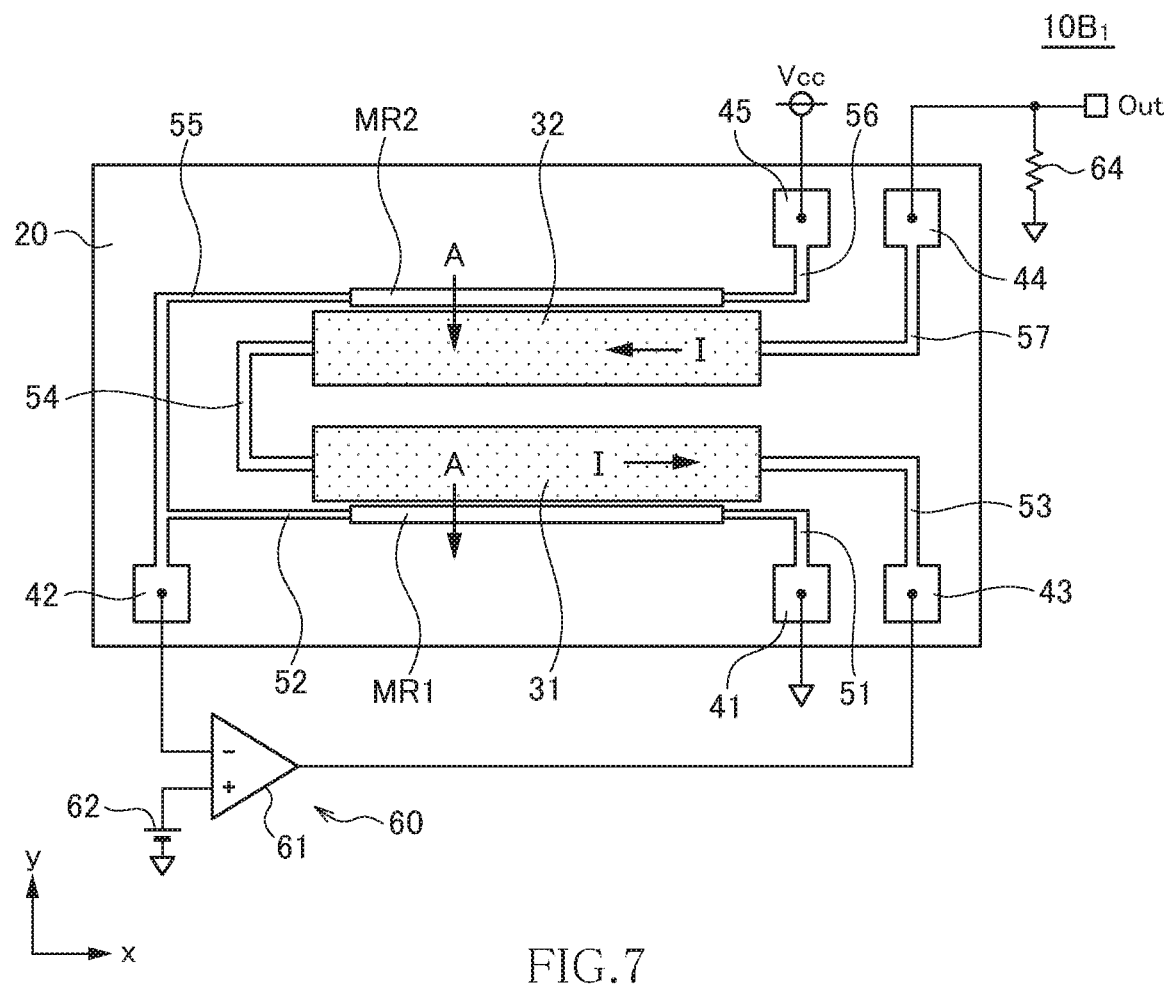
FIG. 7 is a top view illustrating the configuration of a magnetic sensor $10B_1$ according to a second embodiment of the present invention.

FIG. 7 is a top view illustrating the configuration of a magnetic sensor $10B_1$ according to the second embodiment of the present invention.

As illustrated in FIG. 7, the magnetic sensor $10B_1$ according to the present embodiment additionally includes a second magnetoresistive effect element MR2, a second magnetic member 32, and a fifth terminal 45. The magnetoresistive effect element MR2 is connected between the second terminal 42 and the fifth terminal 45 and extends in the x-direction like the magnetoresistive effect element MR1. The magnetism fixing direction of the magnetoresistive effect element MR2 is the same as that of the magnetoresistive effect element MR1 as denoted by the arrow A.

One end of the magnetoresistive effect element MR2 in the x-direction is electrically connected to the second terminal 42 through a fifth wiring 55, and the other end thereof in the x-direction is electrically connected to the fifth terminal 45 through a sixth wiring 56. As a result, the magnetoresistive effect element MR2 is electrically connected between the second and fifth terminals 42 and 45. When current flows between the first terminal 41 and the fifth terminal 45, the direction of current flowing in the magnetoresistive effect element MR1 and the direction of current flowing in the magnetoresistive effect element MR2 are opposed to each other. For example, when current flows from the fifth terminal 45 to the first terminal 41, the direction of current flowing in the magnetoresistive effect element MR1 is the positive x-direction, while the direction of current flowing in the magnetoresistive effect element MR2 is the negative x-direction.

While the magnetic member 32 extends in the x-direction along the magnetoresistive effect element MR2, the magnetic member 32 and the magnetoresistive effect element MR2 do not overlap each other in a plan view (that is, when viewed in the z-direction), and the magnetoresistive effect element MR2 is disposed offset in the y-direction with respect to the magnetic member 32. The offset direction of the magnetoresistive effect element MR2 is opposite to the offset direction of the magnetoresistive effect element MR1 with respect to the magnetic member 31. Specifically, the magnetoresistive effect element MR1 is offset in the negative y-direction with respect to the magnetic member 31, while the magnetoresistive effect element MR2 is offset in the positive y-direction with respect to the magnetic member 32. One end of the magnetic member 32 in the x-direction is electrically connected to the magnetic member 31 through the fourth wiring 54, and the other end thereof in the x-direction is electrically connected to the fourth terminal 44 through a seventh wiring 57. As a result, the magnetic members 31 and 32 are electrically connected in series between the third and fourth terminals 43 and 44.

FIG. 7 also illustrates a feedback circuit 60 connected to the first to fifth terminals 41 to 45. Also in the present embodiment, the non-inversion input terminal (+) of the operation amplifier 61 is connected to the constant voltage source 62, and the inversion input terminal (−) thereof is connected to the second terminal 42. However, the constant current source 63 illustrated in FIG. 4 is not used, and instead, the fifth terminal is connected to a power supply Vcc.

Figure 8:
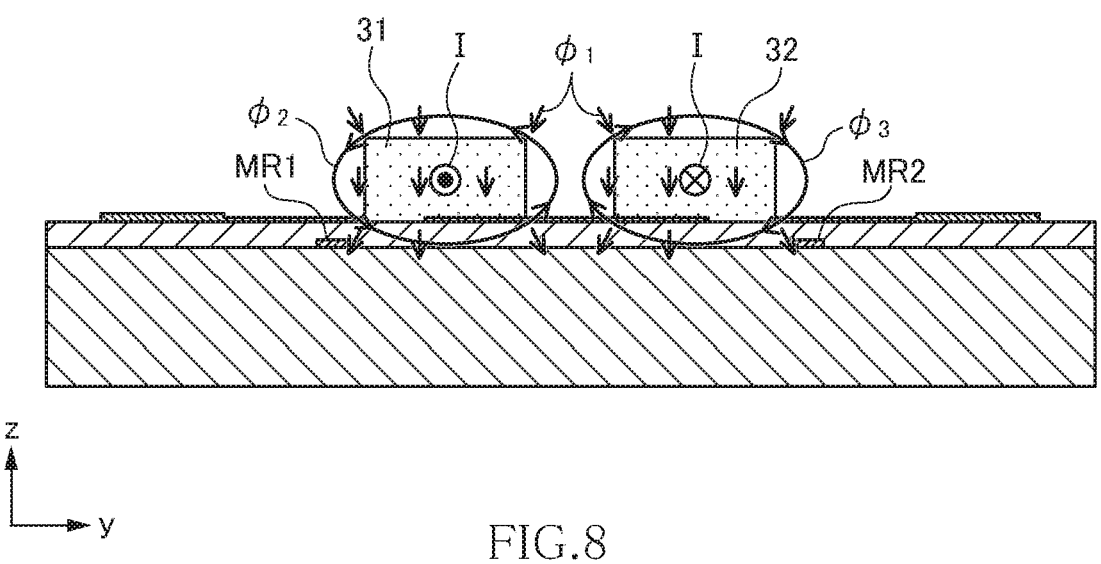
FIG. 8 is a schematic diagram for explaining a direction of magnetic fluxes ϕ1 to ϕ3.

In such a circuit configuration, as illustrated in FIG. 8, when the magnetic flux $\phi 1$ to be detected is given in the z-direction, it is collected by the magnetic members 31 and 32, then bent in the y-direction, and returned to the source of the magnetic flux. Since the magnetoresistive effect element MR1 is disposed on the negative side in the y-direction with respect to the magnetic member 31, and the magnetoresistive effect element MR2 is disposed on the positive side in the y-direction with respect to the magnetic member 32, the resistance values of the respective magnetoresistive effect elements MR1 and MR2 are varied by the magnetic flux $\phi 1$. In the example of FIG. 8, the magnetic flux $\phi 1$ is applied in the negative y-direction to the magnetoresistive effect element MR1, and the magnetic flux $\phi 1$ is applied in the positive y-direction to the magnetoresistive effect element MR2. As described above, the magnetization fixing directions of the respective magnetoresistive effect elements MR1 and MR2 are the same as each other, so that when the resistance value of the magnetoresistive effect element MR1 is increased by the magnetic flux $\phi 1$, the resistance value of the magnetoresistive effect element MR2 reduces; conversely, when the resistance value of the magnetoresistive effect element MR1 is reduced by the magnetic flux $\phi 1$, the resistance value of the magnetoresistive effect element MR2 increases. That is, the magnetoresistive effect elements MR1 and MR2 constitute a differential circuit.

Thus, the potential level of the second terminal 42 which is a connection point between the magnetoresistive effect elements MR1 and MR2 varies according to the strength of the magnetic flux $\phi 1$. For example, when the resistance value of the magnetoresistive effect element MR1 is increased and, hence, the resistance value of the magnetoresistive effect element MR2 reduces, the potential level of the second terminal 42 rises. When the potential level of the second terminal 42 is varied, the potential level of the output terminal of the operation amplifier 61 varies correspondingly. For example, when the potential level of the second terminal 42 is raised, the potential level of the output terminal of the operation amplifier 61 lowers, with the result that the feedback current I flows from the fourth terminal 44 to the third terminal 43.

In the present embodiment, the feedback current I flows in the magnetic members 31 and 32. The magnetic members 31 and 32 are connected in a folded-back manner, so that the directions of the feedback current I flowing in the magnetic members 31 and 32 are opposed to each other. Therefore, when, for example, the feedback current I flows from the fourth terminal 44 to the third terminal 43, magnetic flux $\phi 2$ is generated thereby in the magnetic member 31 in the direction illustrated in FIG. 8 and flows in the positive y-direction at a position where the magnetoresistive effect element MR1 exists. On the other hand, magnetic flux $\phi 3$ is generated in the magnetic member 32 in the direction illustrated in FIG. 8 and flows in the negative y-direction at a position where the magnetoresistive effect element MR2 exists. That is, the magnetic flux $\phi 1$ and the magnetic flux $\phi 2$ cancel each other and, at the same time, the magnetic flux $\phi 1$ and the magnetic flux $\phi 3$ cancel each other, achieving feedback in such a direction that the resistance values of the magnetoresistive effect elements MR1 and MR2 varied by the magnetic flux $\phi 1$ to be detected are set back to the original values, so that closed loop control is made possible. An actual detection result is obtained by a not-shown detection circuit based on the output level Out of the fourth terminal 44.

As described above, the magnetic sensor $10B_1$ according to the present embodiment uses the two magnetoresistive effect elements MR1 and MR2 and two magnetic members 31 and 32, so that a variation in the potential level of the second terminal 42 caused by the magnetic flux $\phi 1$ to be detected becomes large. Thus, it is possible to perform detection with higher sensitivity than when the magnetic sensor 10A according to the first embodiment is used.

Figure 9:
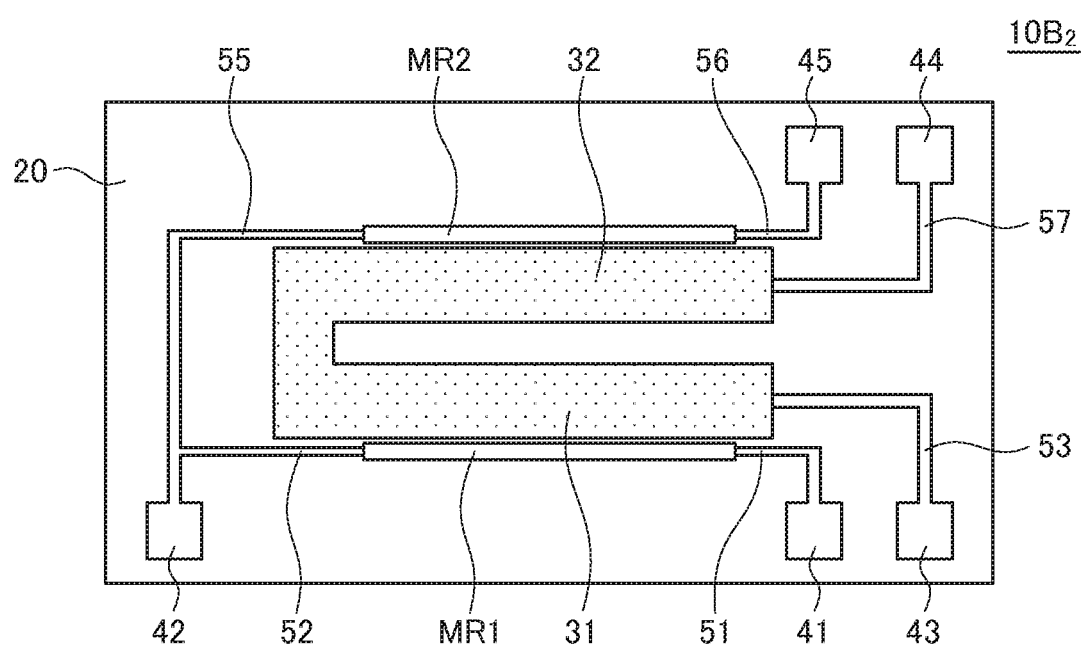
FIG. 9 is a top view illustrating the configuration of a magnetic sensor $10B_2$ according to a modification of the second embodiment.

FIG. 9 is a top view illustrating the configuration of a magnetic sensor $10B_2$ according to a modification of the second embodiment. The magnetic sensor $10B_2$ illustrated in FIG. 9 differs from the magnetic sensor $10B_1$ illustrated in FIG. 7 in that the magnetic members 31 and 32 are integrated into a U-shape. Other configurations are the same as those of the magnetic sensor $10B_1$ illustrated in FIG. 7. Thus, when obtaining the differential signal by using the two magnetoresistive effect elements MR1 and MR2, the corresponding magnetic members 31 and 32 need not be formed of different members but may be formed of a single member as in the modification illustrated in FIG. 9.

Figure 10:
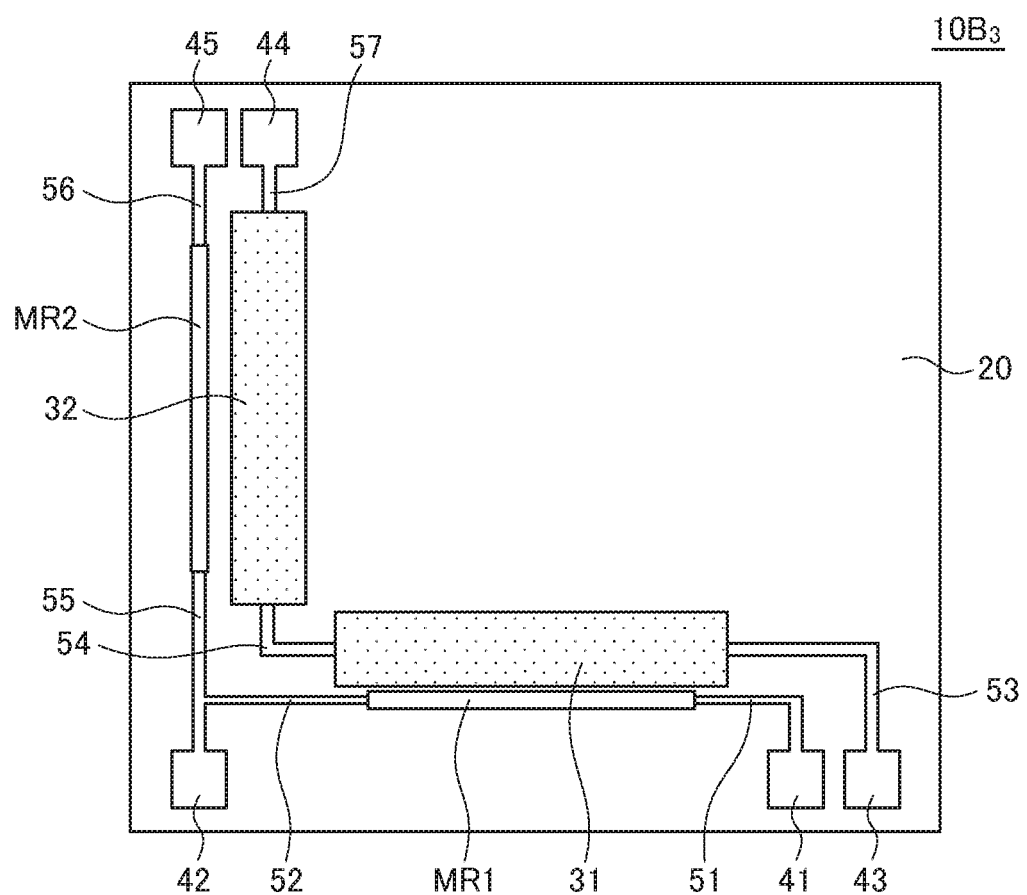
FIG. 10 is a top view illustrating the configuration of a magnetic sensor $10B_3$ according to another modification of the second embodiment.

FIG. 10 is a top view illustrating the configuration of a magnetic sensor $10B_3$ according to another modification of the second embodiment. The magnetic sensor $10B_3$ illustrated in FIG. 10 differs from the magnetic sensor $10B_1$ illustrated in FIG. 7 in that the magnetoresistive effect element MR2 and magnetic member 32 extend in the x-direction. Other configurations are the same as those of the magnetic sensor $10B_1$ illustrated in FIG. 7. Thus, when obtaining the differential signal by using the two magnetoresistive effect elements MR1 and MR2, the magnetoresistive effect elements MR1 and MR2 need not extend in the same direction and may cross each other at right angles as in the modification illustrated in FIG. 10.

It is apparent that the present invention is not limited to the above embodiments, but may be modified and changed without departing from the scope and spirit of the invention.

While, for example, a block member made of a magnetic material is used as the magnetic members 31 and 32 in the above embodiments, the present invention is not limited to this, and a thin film made of a magnetic material may be used in place of the block member. In this case, the magnetic members 31 and 32 may be formed on the wiring layer L2 by using a thin-film formation method such as sputtering.

REFERENCE SIGNS LIST

10A, $10B_1$-$10B^3$ magnetic sensor
20 sensor chip
21 substrate
22 insulating film
31 first magnetic member
32 second magnetic member
41-45 terminal
51-57 wiring
58,59 through-conductor
60 feedback circuit
61 operation amplifier
62 constant voltage source
64 constant current source
64 resistor
I feedback current
L1 first wiring layer
L2 second wiring layer
MR1 first magnetoresistive effect element
MR2 second magnetoresistive effect element
φ1-φ3 magnetic flux

What is claimed is:

1. A magnetic sensor comprising:
   first to fourth terminals;
   a first magnetoresistive effect element electrically connected between the first and second terminals and extending in a first direction;
   a first magnetic member electrically connected between the third and fourth terminals and extending in the first direction along the first magnetoresistive effect element; and
   a feedback circuit configured to make feedback current flow between the third and fourth terminals based on a potential appearing at the first or second terminal;
   wherein the first magnetoresistive effect element is disposed offset with respect to a center position of the first magnetic member in a second direction crossing the first direction.

2. The magnetic sensor as claimed in claim 1, wherein the first magnetoresistive effect element is disposed at a position that does not overlap the first magnetic member when viewed in a third direction crossing the first and second directions.

3. The magnetic sensor as claimed in claim 1, wherein a length of the first magnetic member in the first direction is equal to or larger than a length of the first magnetoresistive effect element in the first direction.

4. The magnetic sensor as claimed in claim 1, further comprising:
   a fifth terminal;
   a second magnetoresistive effect element electrically connected between the second and fifth terminals and extending in a predetermined direction; and
   a second magnetic member electrically connected between the third and fourth terminals and extending in the predetermined direction along the second magnetoresistive effect element,
   wherein the second magnetoresistive effect element is disposed offset with respect to a center position of the second magnetic member in a direction crossing the predetermined direction.

5. The magnetic sensor as claimed in claim 1, wherein the first magnetoresistive effect element is formed on a first wiring layer of a sensor chip, and the first magnetic member is formed on a second wiring layer of the sensor chip different from the first wiring layer.

6. The magnetic sensor as claimed in claim 5, wherein the first magnetic member is a block member made of a magnetic material and fixed to the second wiring layer.

7. The magnetic sensor as claimed claim 5, wherein the first magnetic member is a thin film made of a magnetic material and formed on the second wiring layer.

8. The magnetic sensor as claimed in claim 1, wherein the first magnetic member is made of a soft magnetic material.

9. A magnetic sensor comprising:
   a magnetoresistive effect element;
   a magnetic member collecting magnetic flux to be detected and leading the magnetic flux in a direction parallel to a magnetism fixing direction of the magnetoresistive effect element; and
   a feedback circuit configured to make feedback current flow to the magnetic member according to a resistance of the magnetoresistive effect element.

10. A magnetic sensor comprising:
    first to fourth terminals;
    a first magnetoresistive effect element electrically connected between the first and second terminals and extending in a first direction; and
    a first magnetic member electrically connected between the third and fourth terminals and extending in the first direction along the first magnetoresistive effect element,
    wherein the first magnetoresistive effect element is formed on a first wiring layer of a sensor chip, and the first magnetic member is formed on a second wiring layer of the sensor chip different from the first wiring layer, and
    wherein the first magnetoresistive effect element is disposed offset with respect to a center position of the first magnetic member in a second direction crossing the first direction.

11. The magnetic sensor as claimed in claim 10, wherein the first magnetoresistive effect element is disposed at a position that does not overlap the first magnetic member when viewed in a third direction crossing the first and second directions.

12. The magnetic sensor as claimed in claim 10, wherein a length of the first magnetic member in the first direction is equal to or larger than a length of the first magnetoresistive effect element in the first direction.

13. The magnetic sensor as claimed in claim 10, further comprising:
    a fifth terminal;
    a second magnetoresistive effect element electrically connected between the second and fifth terminals and extending in a predetermined direction; and a second magnetic member electrically connected between the third and fourth terminals and extending in the predetermined direction along the second magnetoresistive effect element, wherein the second magnetoresistive effect element is disposed offset with respect to a center position of the second magnetic member in a direction crossing the predetermined direction.

14. The magnetic sensor as claimed in claim 10, wherein the first magnetic member is a block member made of a magnetic material and fixed to the second wiring layer.

15. The magnetic sensor as claimed in claim 10, wherein the first magnetic member is a thin film made of a magnetic material and formed on the second wiring layer.

16. The magnetic sensor as claimed in claim 10, wherein the first magnetic member is made of a soft magnetic material.

* * * * *